(12) United States Patent
Foster et al.

(10) Patent No.: US 8,264,307 B2
(45) Date of Patent: Sep. 11, 2012

(54) DUAL SUBSTRATE MEMS PLATE SWITCH AND METHOD OF MANUFACTURE

(75) Inventors: John S. Foster, Santa Barbara, CA (US); Alok Paranjypye, Santa Barbara, CA (US); Paul J. Rubel, Santa Barbara, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 12/929,259

(22) Filed: Jan. 11, 2011

(65) Prior Publication Data

US 2011/0155548 A1   Jun. 30, 2011

Related U.S. Application Data

(63) Continuation-in-part of application No. 11/797,924, filed on May 9, 2007, now Pat. No. 7,893,798.

(51) Int. Cl.
*H01H 51/22* (2006.01)
(52) U.S. Cl. .......................................... 335/78; 200/181
(58) Field of Classification Search .................... 335/78; 200/181
See application file for complete search history.

(56) References Cited

U.S. PATENT DOCUMENTS

| | | | |
|---|---|---|---|
| 6,396,372 B1 | 5/2002 | Sakata et al. | |
| 6,486,425 B2 | 11/2002 | Seki | |
| 6,624,003 B1 * | 9/2003 | Rice | 438/106 |
| 7,008,812 B1 | 3/2006 | Carley | |
| 7,119,943 B2 | 10/2006 | Nelson et al. | |
| 7,528,691 B2 * | 5/2009 | Wallis et al. | 335/78 |
| 2006/0286706 A1 | 12/2006 | Salian et al. | |
| 2006/0286707 A1 | 12/2006 | Hooper et al. | |
| 2007/0236313 A1 * | 10/2007 | Wallis et al. | 335/220 |

* cited by examiner

*Primary Examiner* — Bernard Rojas
(74) *Attorney, Agent, or Firm* — Jaquelin K. Spong

(57) ABSTRACT

Systems and methods for forming an electrostatic MEMS plate switch include forming a deformable plate on a first substrate, forming the electrical contacts on a second substrate, and coupling the two substrates using a hermetic seal. The deformable plate may have at least one shunt bar located at a nodal line of a vibrational mode of the deformable plate, so that the shunt bar remains relatively stationary when the plate is vibrating in that vibrational mode. A hermetic seal may be made around the device with a larger, secondary enclosure. Electrical access to the deformable plate may be accomplished by an electrical path which is independent of the seal. The electrical path may include a via through the first substrate or the second substrate, or a flash deposited on an external region of the switch.

22 Claims, 12 Drawing Sheets

DUAL SUBSTRATE MEMS PLATE SWITCH AND METHOD OF MANUFACTURE

CROSS REFERENCE TO RELATED APPLICATIONS

This U.S. patent application is a continuation-in-part of U.S. patent application Ser. No. 11/797,924, filed May 9, 2007, which is related to U.S. patent application Ser. No. 11/211,623, filed Aug. 26, 2005 and incorporated by reference herein in its entirety.

STATEMENT REGARDING FEDERALLY SPONSORED RESEARCH

Portions of the present invention were made with U.S. Government support under NSF SBIR Grant No. 0637474. The government may have certain rights in this invention.

STATEMENT REGARDING MICROFICHE APPENDIX

Not applicable.

BACKGROUND

This invention relates to a microelectromechanical systems (MEMS) switch device, and its method of manufacture. More particularly, this invention relates to a MEMS electrostatic plate switch, which is manufactured on two separate substrates.

Microelectromechanical systems are devices often having moveable components which are manufactured using lithographic fabrication processes developed for producing semiconductor electronic devices. Because the manufacturing processes are lithographic, MEMS devices may be made in very small sizes, and in large quantities. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) wafers, which are a relatively thick silicon "handle" wafer with a thin silicon dioxide insulating layer, followed by a relatively thin silicon "device" layer. In the MEMS devices, a thin cantilevered beam of silicon may be etched into the silicon device layer, and a cavity is created adjacent to the thin beam, typically by etching the thin silicon dioxide layer below it to allow for the electrostatic deflection of the beam. Electrodes provided above or below the beam may provide the voltage potential which produces the attractive (or repulsive) force to the cantilevered beam, causing it to deflect within the cavity.

One known embodiment of such an electrostatic relay is disclosed in U.S. Pat. No. 6,486,425 to Seki. The electrostatic relay described in this patent includes a fixed substrate having a fixed terminal on its upper surface and a moveable substrate having a moveable terminal on its lower surface. Upon applying a voltage between the moveable electrode and the fixed electrode, the moveable substrate is attracted to the fixed substrate such that an electrode provided on the moveable substrate contacts another electrode provided on the fixed substrate to close the microrelay.

However, to fabricate the microrelay described in U.S. Pat. No. 6,486,425, the upper substrate must be moveable, so that the upper substrate must be thin enough such that the electrostatic force may cause it to deflect. The moveable substrate is formed from a silicon-on-insulator (SOI) wafer, wherein the moveable feature is formed in the silicon device layer, and the SOI wafer is then adhered to the fixed substrate. The silicon handle wafer and silicon dioxide insulating layer are then removed from the SOI wafer, leaving only the thin silicon device layer which forms the moveable structure.

SUMMARY

Because the top substrate of the microrelay described in the '425 patent must necessarily be flexible enough to be moveable, it is also delicate and susceptible to damage from contact during or after fabrication.

The systems and methods described here form an electrostatic MEMS plate switch using dual substrates, a first, lower substrate on which to form a deformable plate with at least one electrical shunt bar to provide an electrical connection between two contacts of a switch. These contacts may be formed on a second, upper substrate. After forming these structures, the two substrates are bonded together to form the switch. It should be understood that the designation of "upper" and "lower" is arbitrary, that is, the deformable plate may also be formed on an upper substrate and the contacts may be formed on a lower substrate.

The electrostatic MEMS plate design may have a number of advantages over cantilevered switch designs. For example, in a plate design, the stiffness of the restoring force on the plate may no longer be determined by the plate dimensions, but instead may be determined by spring beams which support the deformable plate over the substrate surface. Therefore, weaker or stronger restoring forces may be used without impacting the plate dimensions. This may allow the spacing of the contacts of the switch to be larger, or smaller, than that of the cantilever design without affecting the stiffness of the moveable structure. Because the restoring force is provided by spring beams, the device may be made more compact than the cantilevered designs, which may require a certain length of cantilevered beam to provide sufficient flexibility. Also, multiple switches may be placed on a single deformable plate, whereas with the cantilevered design, only the area at the distal end of the cantilevered beam is generally appropriate for the placement of the switch.

Accordingly, in the systems and methods described here, the deformable plate is attached to the first SOI substrate by one or more narrow spring beams formed in the device layer of the SOI substrate. These spring beams remain fixed at their proximal ends to the silicon dioxide and handle layer of the SOI substrate. A portion of the silicon dioxide layer adjacent to the deformable plate may be etched to release the plate, however, a silicon dioxide attachment point remains which couples the spring beams supporting the deformable plate to the silicon handle layer. The silicon dioxide layer therefore provides the anchor point for adhesion of the deformable plate to the first, lower SOI substrate from which it was made. Because the remainder of the rigid, SOI wafer remains intact, it may provide protection for the switch against inadvertent contact and shock.

Because the rigid SOI wafer remains intact, it may also be hermetically bonded to a second, upper substrate at the end of the fabrication process. By forming the hermetic seal, the switch may enclose a particular gas environment which may be chosen to increase the breakdown voltage of the gas environment within the switch. Alternatively, the environment surrounding the plate switch may be vacuum, which may increase the switching speed of the plate switch by decreasing viscous squeeze film damping which may arise in a gas environment. The hermetic seal may also protect the electrostatic MEMS switch from ambient dust and debris, which may otherwise interfere with the proper functioning of the device.

The deformable plate formed on the first substrate may carry one or more shunt bars, placed at or near the nodal lines for a vibrational mode of the deformable plate. Points along these lines remain relatively stationary, even though the deformable plate may still be vibrating in the vibrational mode. In one exemplary embodiment, the deformable plate may carry two shunt bars, each placed on a nodal line for a particular vibrational mode of the deformable plate known as the (2,0) mode, hereinafter called the third mode. This mode is well known to those well versed in the art of plate modes. By placing the shunt bars in these locations along nodal lines, the switch is relatively insensitive to continuing vibrations, and the switch may remain closed even when the deformable plate is still oscillating.

In one exemplary embodiment, the deformable plate is coupled to the first, SOI substrate by four flexible spring beams which are anchored to the dielectric layer of the SOI substrate at the proximal end of each spring beam. The other end of the spring beams may be contiguous with the deformable plate. The spring beams may include a substantially ninety degree bend, so that each spring beam on one side of the deformable plate extends in an opposite direction from the other. This embodiment may be referred to as the symmetric embodiment, as the two spring beams on each side of the deformable plate may have the same shapes and orientations as the two spring beams on the other side of the deformable plate. In another "asymmetric" embodiment, the spring beams on one side of the deformable plate may extend in one direction, and the spring beams on the other side of the deformable plate may extend in the opposite direction. The asymmetric embodiment may therefore be capable of twisting during vibration, which may provide a scrubbing action to the deformable plate. The scrubbing action may clear contamination and debris, thus reducing the contact resistance between the shunt bars on the deformable plate and the contacts located on the second substrate.

In one exemplary embodiment, etch release holes may be placed between the nodal lines of the deformable plate, so that the deformable plate may be made more flexible in critical regions. The etch release holes may thereby encourage vibration in a particular vibrational mode over vibrations in other modes. In other exemplary embodiments, the etch release holes may be placed uniformly about the deformable plate in a close-packed hexagonal array. This arrangement may reduce the mass of the deformable plate, and allow ambient gas to flow through the etch release holes and thus reducing squeeze film damping and increasing the switching speed of the deformable plate.

In one exemplary embodiment, the method for manufacturing the MEMS switch may include forming a deformable plate on a first substrate, forming at least one electrode on a second substrate, and coupling the first substrate to the second substrate with a seal that encloses the MEMS switch. By forming these features on separate substrates, the cleanliness of the contact points may be maintained during processing, before the substrates are sealed hermetically.

The seal may be hermetic, made by forming an alloy of gold and indium, $AuIn_x$, where x is about 2. The alloy may be formed by melting a layer of indium deposited over a layer of gold. The hermetic seal is therefore also conductive, and may provide electrical access to the deformable plate, for example. The hermetic seal may be particularly important for switching applications involving relatively high voltage signals, wherein an insulating gas may be needed to prevent electrical breakdown of the environment between the high voltage electrodes. In such cases, the insulating gas, or vacuum, may need to be sealed hermetically to create an environment for the MEMS switch which can withstand higher voltages without breaking down, without allowing the gas to leak out of, or into, the MEMS switch seal.

In another exemplary embodiment, electrical access to the switch may be gained using through-hole vias formed through the second substrate. By providing electrical access through the second substrate, the hermetic seal may not be compromised by the presence of electrical leads being routed under the bond line.

The systems and methods described herein may be appropriate for the fabrication of an RF electrostatic MEMS plate switch which is capable of operating in the range of DC to 10 GHz.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

DETAILED DESCRIPTION

In the systems and methods described here, an electrostatic MEMS switch is fabricated on two substrates. A deformable plate carrying at least one shunt bar is formed on the first substrate, and the electrical contacts of the switch, which will be connected via the shunt bar on the deformable plate when the switch is closed, are formed on the other substrate. The two substrates may then be sealed hermetically by a gold-indium seal. Electrical access to the switch may be afforded by a set of through hole vias, which extend through the thickness of the second substrate. Although the systems and methods are described as forming the deformable plate first on the first substrate followed by the electrical contacts on the second substrate, it should be understood that this embodiment is exemplary only, and that the electrical contacts may be formed first, or in parallel with, the formation of the deformable plate.

Figure 1:
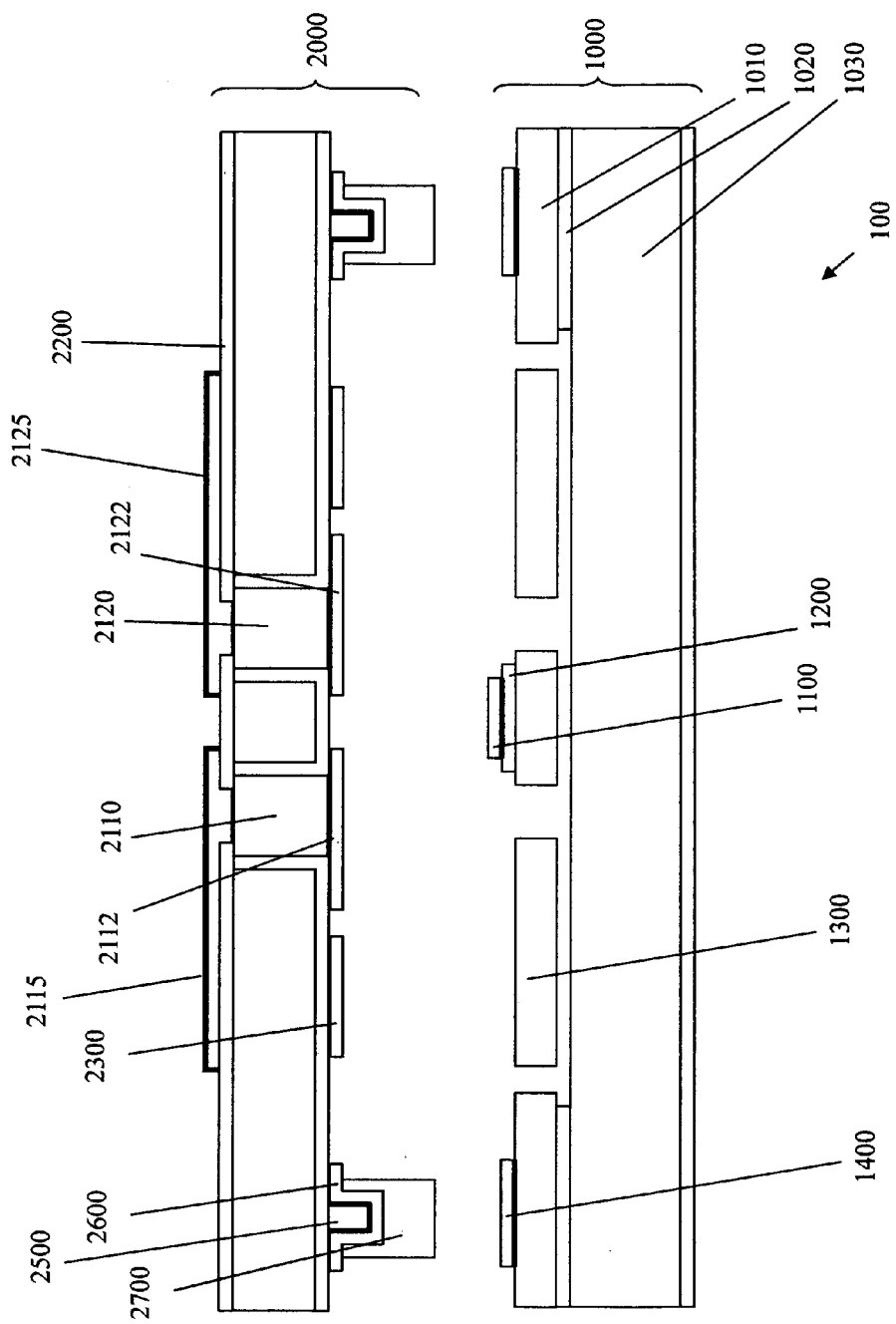
FIG. 1 is a cross sectional view of an exemplary dual substrate electrostatic MEMS plate switch.

FIG. 1 is a cross sectional view of the dual substrate electrostatic MEMS plate switch 100 fabricated on two substrates, a plate substrate 1000 and a via substrate 2000. The plate substrate 1000 may be an SOI wafer, and the via substrate may be a silicon wafer. The switch 100 may include a plate 1300 bearing at least one shunt bar 1100. The plate may be deformable, meaning that it is sufficiently thin compared to its length or its width to be deflected when a force is applied, and may vibrate in response to an impact. For example, a deformable plate may deflect by at least about 10 nm at its center by a force of about 1 μNewton applied at the center, and sufficiently elastic to support vibration in a plurality of vibrational modes. The deformable plate 1300 may be suspended above the handle layer 1030 of an SOI substrate by four spring beams (not shown in FIG. 1), which are themselves affixed to the handle layer 1030 by anchor points formed from the dielectric layer 1020 of the SOI plate substrate 1000. As used herein, the term "spring beam" should be understood to mean a beam of flexible material affixed to a substrate at a proximal end, and formed in substantially one plane, but configured to move and provide a restoring force in a direction substantially perpendicular to that plane. The deformable plate may carry at least one, and preferably two conductive shunt bars which operate to close the switch 100, as described below.

Each shunt bar is designed to span two contact points, 2110 and 2120, which are through wafer vias formed in the via substrate 2000, and covered by a layer of contact material 2112 and 2122, respectively. The deformable plate may be actuated electrostatically by an adjacent electrostatic electrode 2300, which may be disposed directly above (or below) the deformable plate 1300, and may be fabricated on the via substrate 2000. The deformable plate 1300 itself may form one plate of a parallel plate capacitor, with the electrostatic electrode 2300 forming the other plate. When a differential voltage is placed on the deformable plate 1300 relative to the adjacent electrostatic electrode 2300, the deformable plate is drawn toward the adjacent electrostatic electrode 2300. The action raises (or lowers) the shunt bar 1100 into a position where it contacts the contact points 2110 and 2120, thereby closing an electrical circuit. Although the embodiment illustrated in FIG. 1 shows the plate formed on the lower substrate and the vias and contacts formed on the upper substrate, it should be understood that the designation "upper" and "lower" is arbitrary. The deformable plate may be formed on either the upper substrate or lower substrate, and the vias and contacts formed on the other substrate. However, for the purposes of the description which follows, the embodiment shown in FIG. 1 is presented as an example, wherein the plate is formed on the lower substrate and is pulled upward by the adjacent electrode formed on the upper substrate.

Figure 2:
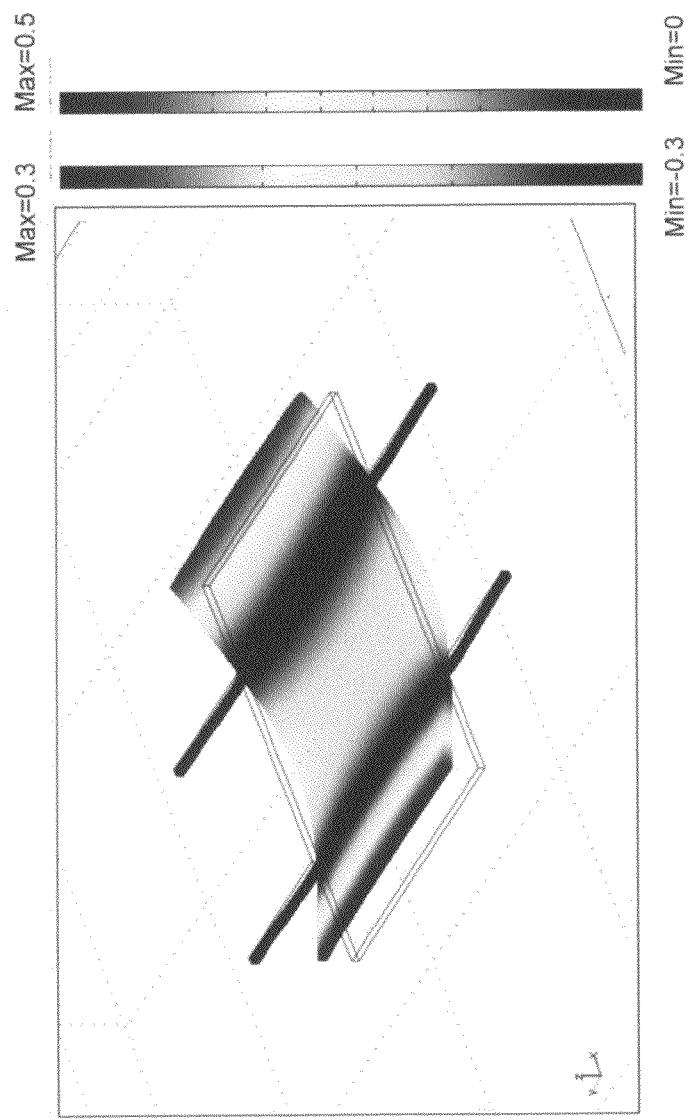
FIG. 2 is a greyscale image of the third vibrational mode of a deformable plate such as that used in the plate switch of FIG. 1.

FIG. 2 is a greyscale image of a thin, deformable plate in a vibrational mode. The image was generated by a finite element model, using plate dimensions of 200 μm width by 300 μm length by 5 μm thickness. The deformable plate is supported by four spring beams 10 μm wide and 5 μm thick, extending from two sides of the deformable plate. According to the model, a first vibrational mode with a frequency of 73 kHz may be simply the movement of the entire plate, substantially undeflected, toward and away from the surface to which it is attached by the spring beams. A second vibrational mode with a frequency of 171 kHz occurs when the deformable plate twists about its long axis, by bending at the joints between the deformable plate and the spring beams.

However, another vibrational mode exists as illustrated by FIG. 2, which is encouraged by the proper placement of the spring beams. The spring beams are placed at approximately the location of the node lines for this vibrational mode. By placing the spring beams at these points, the plate may vibrate with relatively little deflection of the spring beams. The frequency associated with this mode is at about 294 kHz.

As a result, the deformable plate vibrates substantially in the third vibrational mode, with the node lines of the vibration located substantially at the locations of the supporting spring beams. These node lines indicate points on the deformable plate which remain relatively stationary, compared to the ends and central region which are deflected during the vibration. The existence of these node lines indicate advantageous locations for the placement of electrodes for a switch, because even when the plate is vibrating, there is relatively little deflection of the plate along the node lines. Accordingly, if a shunt bar is placed at the node lines, the shunt bar may provide electrical conductivity between two electrodes located beneath the shunt bar, even if the plate continues to vibrate.

Figure 3:
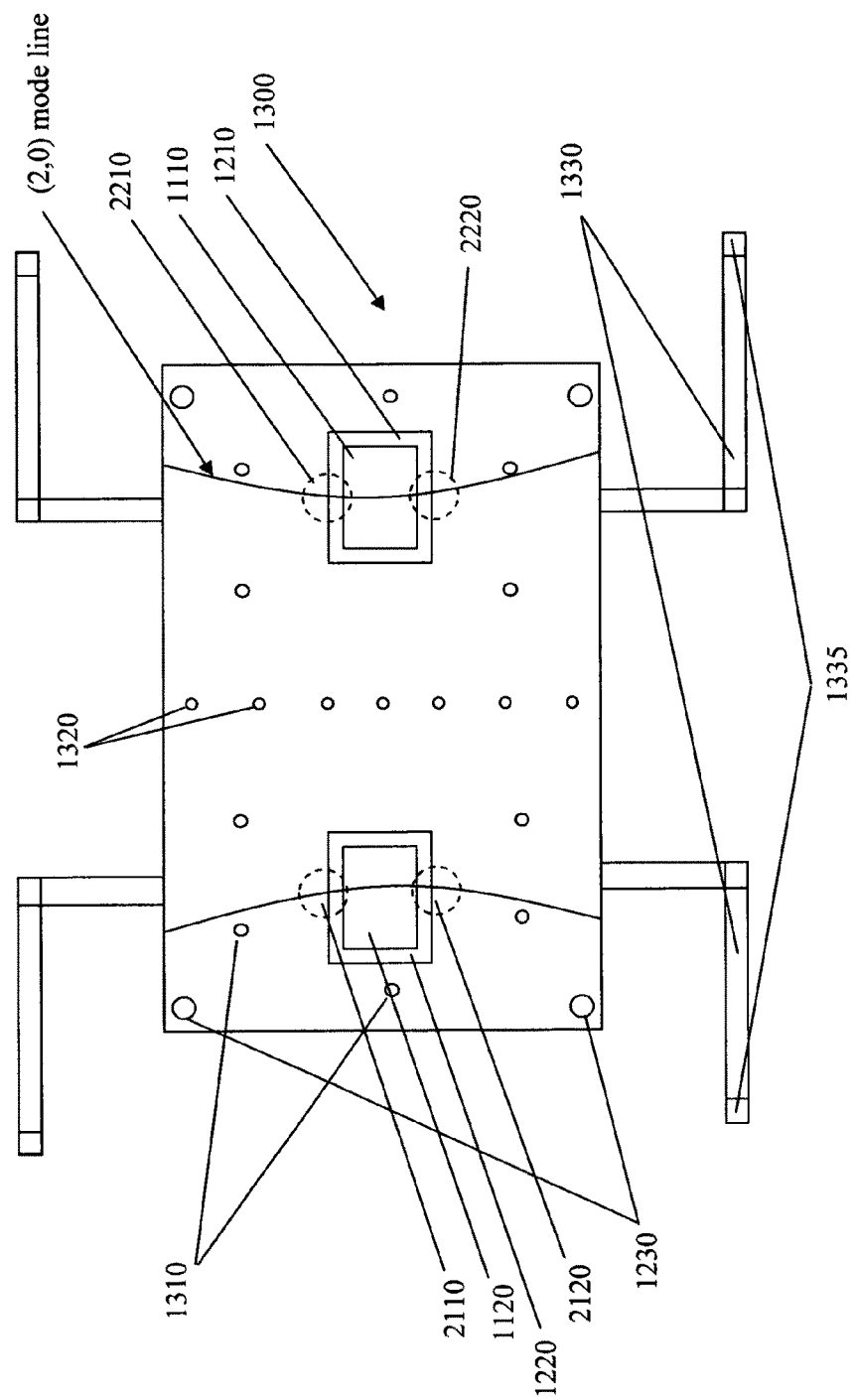
FIG. 3 is a plan view of one exemplary embodiment of the deformable plate of the dual substrate electrostatic MEMS plate switch of FIG. 1, showing the locations of the two shunt bars along the nodal lines of the deformable plate.

FIG. 3 is a plan view of a first exemplary embodiment of a deformable plate useable in the plate switch of FIG. 1. The plate is supported by four spring beams 1330, which are attached to the underlying substrate at their proximal ends 1335. One pair of the four spring beams may be disposed on one side of the deformable plate, and another pair of the four spring beams may be disposed on an opposite side of the deformable plate. Each spring beam may have a segment extending from the deformable plate which is coupled to an adjoining segment by a bend. The choice of angle for this bend may affect the kinematics of the deformable plate 1300.

In the embodiment shown in FIG. 3, the spring beams include a ninety degree bend, such that each spring beam on each side of the deformable plate 1300 extends in an opposite direction to the adjacent spring beam. This embodiment may be referred to as the symmetric embodiment, as the orientation of the deformable plate and spring beams is symmetric with respect to reflection across either a longitudinal or latitudinal axis of the deformable plate, wherein the longitudinal or latitudinal axis is defined as horizontal or vertical line, respectively, passing through the center of the deformable plate. It should be understood that this embodiment is exemplary only, and that the spring beams may bend with other angles, for example, twenty or thirty degrees, rather than ninety as shown in FIG. 3.

The two nodal lines for the third vibrational mode are shown in FIG. 3. One of two shunt bars 1110 and 1120 may be placed across each nodal line. The shunt bars 1110 and 1120 may be electrically isolated from the deformable plate by a layer of dielectric 1210 and 1220, respectively. Additional dielectric standoffs 1230 may be formed at the corners of deformable plate 1300, to prevent deformable plate 1300 from contacting the adjacent electrostatic electrode 2300 at the corners of deformable plate 1300, when actuated by the adjacent electrostatic electrode 2300. The shunt bars 1110 and 1120 may be dimensioned appropriately to span the distance between two underlying electrical contacts, 2110 and 2120 under shunt bar 1110, and contacts 2210 and 2220 under shunt bar 1120. The deformable plate 1300 is actuated when a voltage differential is applied to an adjacent electrode, which pulls the deformable plate 1300 toward the adjacent electrode. If the deformable plate 1300 vibrates as a result of actuation, it is likely to vibrate in the third vibrational mode shown in FIG. 2. Accordingly, the shunt bars 1110 and 1120 are placed advantageously at the nodal lines of this vibrational mode.

The tendency of deformable plate 1300 to vibrate in the third vibrational mode may be enhanced by placing etch release holes 1320 along the latitudinal axis passing through the center of the deformable plate, between the nodal lines, as shown in FIG. 3. These etch release holes are used to assist the liquid etchant in accessing the far recessed regions beneath the deformable plate, to remove the dielectric layer beneath the plate, as described further in the exemplary manufacturing process set forth below. By placing these etch release holes appropriately, the deformable plate 1300 may be made more flexible in certain regions, such as along the latitudinal axis, such that the plate is encouraged to vibrate in a mode such that the maximum deflection occurs where the plate is more flexible. For example, to encourage the vibration as shown in FIG. 2, the plate may be made more flexible along its latitudinal axis, in order to accommodate the regions undergoing the maximum deflection, by placing etch release holes 1320 along this latitudinal axis.

In another alternative embodiment, the etch release holes are disposed in a close-packed hexagonal array over the entire surface of the deformable plate 1300. Such an embodiment may be advantageous in that the mass of the deformable plate is reduced, and multiple pathways are provided for the flow of the ambient gas to either side of the deformable plate. Both of these effects may improve the switching speed of the device by reducing the inertia of the deformable plate 1300 and reducing the effects of squeeze film damping.

Figure 4:
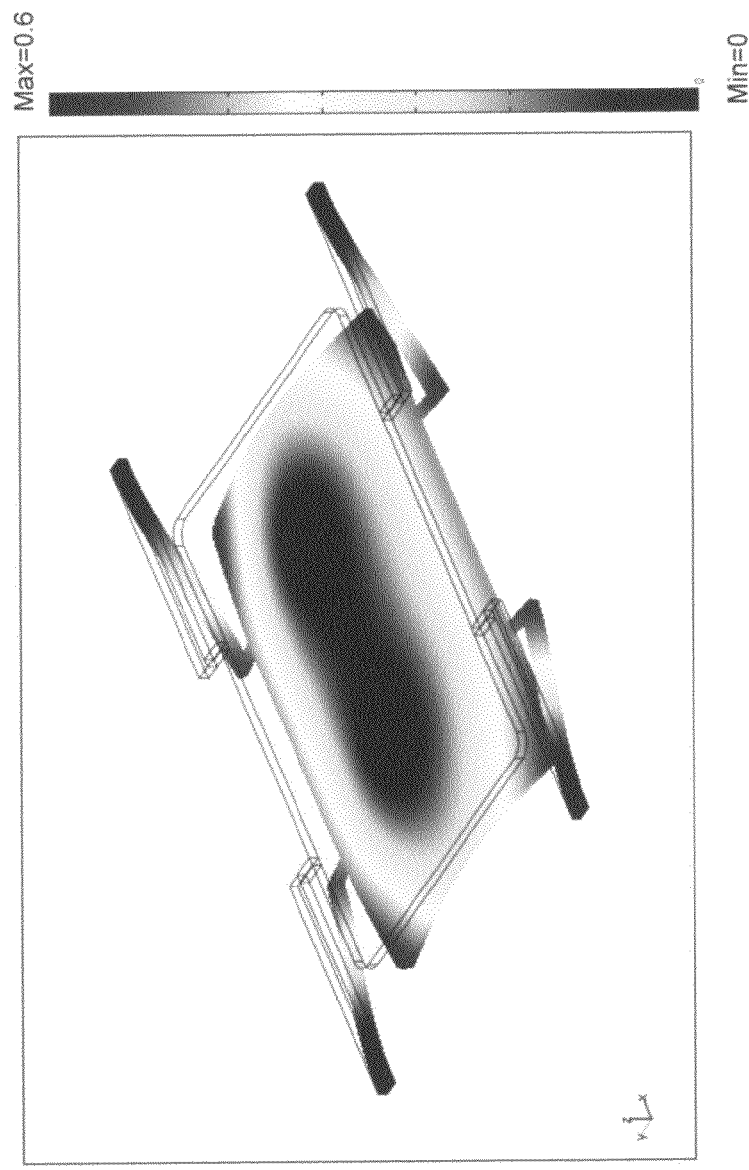
FIG. 4 is a greyscale image of the deformable plate in the third vibrational mode upon making contact with electrodes located below the shunt bars.

FIG. 4 is a greyscale image of the deformable plate shown in FIG. 3, after actuation by an adjacent electrode, calculated by a finite element model. As shown in FIG. 4, the deformable plate is pulled down toward the adjacent electrode, which in this case is located beneath the deformable plate 1300. The lowest areas of the deformed plate are in the vicinity of the contacts, also located beneath the deformable plate 1300. When the deformable plate is deflected as shown in FIG. 4, the shunt bars affixed to the deformable plate are lowered onto the underlying contacts, thus providing a conductive path between the contacts and closing the switch 100. Any residual vibration in the deformable plate is primarily in the third vibrational mode, depicted in FIG. 2. Thus, for shunt bars placed as shown in FIG. 3, the residual vibration does not substantially affect the ability of switch 100 to close the conductive path between the contacts.

Also as shown in FIG. 4, the corners of deformable plate 1300 tend to be drawn towards the adjacent actuation electrode. The dielectric standoffs 1230 may prevent the touching of corners of the deformable plate 1300 to the adjacent electrode, thus shorting the actuation voltage. The actuation voltage in this simulation is about 40 volts, and the size of the deformable plate is about 200 µm by 300 µm. This actuation voltage produces a deflection of at least about 0.6 µm in the deformable plate. This deflection is about ⅓ of the overall separation between the shunt bars and the electrodes, which may nominally be about 1.5 µm, and is sufficient to cause snap-down of the deformable plate onto the underlying contacts. Although as shown in FIG. 4, the maximum deflection is near the center of the plate, this effect may be altered by disposing the spring beams at an angle shallower than ninety degrees. Such an arrangement may result in a more consistent force being applied between the shunt bar and each of the underlying contacts.

Figure 5:
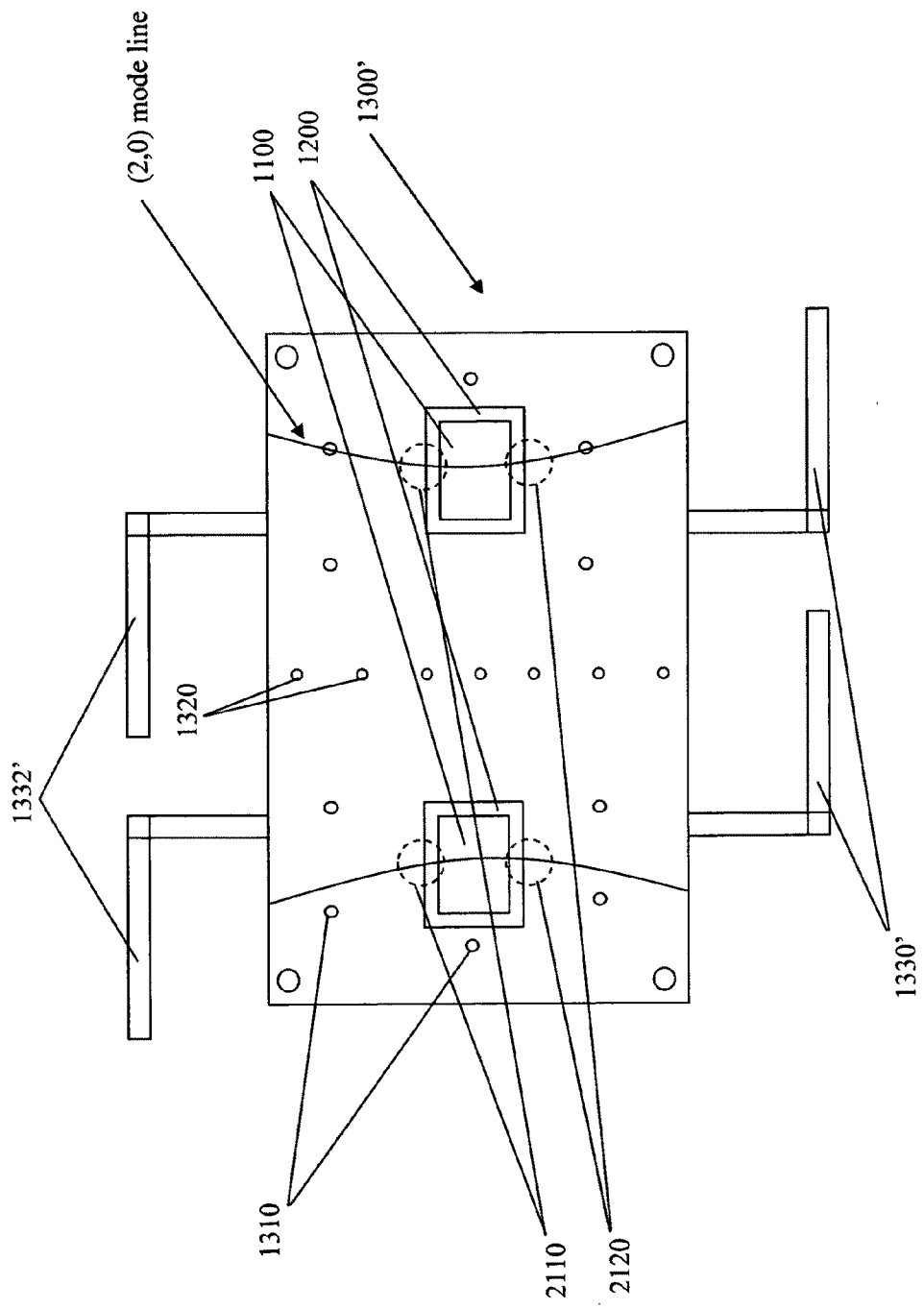
FIG. 5 is a plan view of a second exemplary embodiment of a deformable plate usable in the dual substate MEMS plate switch of FIG. 1.

FIG. 5 is a plan view of a second exemplary embodiment of the deformable plate 1300'. Deformable plate 1300' may differ from deformable plate 1300 by the placement and orientation of the four spring beams which support the deformable plate 1300'. A first set of spring beams 1332' are coupled to one side of the deformable plate 1300', and a second set of spring beams 1330' are coupled to the other side of deformable plate 1300'. However, in contrast to the spring beams 1330 of deformable plate 1300, spring beams 1330' extend in an opposite direction to spring beams 1332' of deformable plate 1300', after the bend in spring beams 1330' and 1332'. This may allow deformable plate 1300' to twist and translate somewhat in the plane of the deformable plate 1300', upon actuation by applying a differential voltage between deformable plate 1300' and an adjacent electrode, because of the flexibility of the bend between the beam segments. This twisting action may allow some lateral movement of shunt bars 1100 over contacts 2110 and 2120, thereby scrubbing the surface of the contacts to an extent. This scrubbing action may remove contamination and debris from the contact surfaces, thereby allowing improved contact and lower contact resistance.

The embodiment shown in FIG. 5 may be referred to as the anti-symmetric embodiment, because the spring beams 1330' extend from the beam in an opposite direction compared to spring beams 1332'. In other words, in the anti-symmetric embodiment 1300', the beam springs disposed on one side of the deformable plate are anti-symmetric with respect to the beams springs disposed on the opposite side of the deformable plate. Thus, when deformable plate 1300' is reflected across a longitudinal or latitudinal axis, the spring beams extend in an opposite direction from the bend. It should be understood that although a ninety-degree bend is illustrated in FIG. 5, the bend may have angles other than ninety-degrees, for example, for example, twenty or thirty degrees.

As shown in FIGS. 3 and 5, the deformable plate 1300 may have two shunt bars 1100 placed upon dielectric isolation layers 1100. Each shunt bar may close a respective set of contacts. For example, shunt bar 1110 in FIG. 3 may close one set of contacts 2210 and 2220, whereas shunt bar 1120 may close a second set of contacts 2110 and 2120. Therefore, each dual substrate MEMS plate switch may actually have two sets of switch contacts disposed in parallel with one another. The dual substrate MEMS plate switch may therefore still operate if one set of switch contacts fails. Furthermore, the overall switch resistance is only one-half of the switch resistance that would exist with a single set of switch contacts, because the two switches are arranged in parallel with one another.

Figure 6:
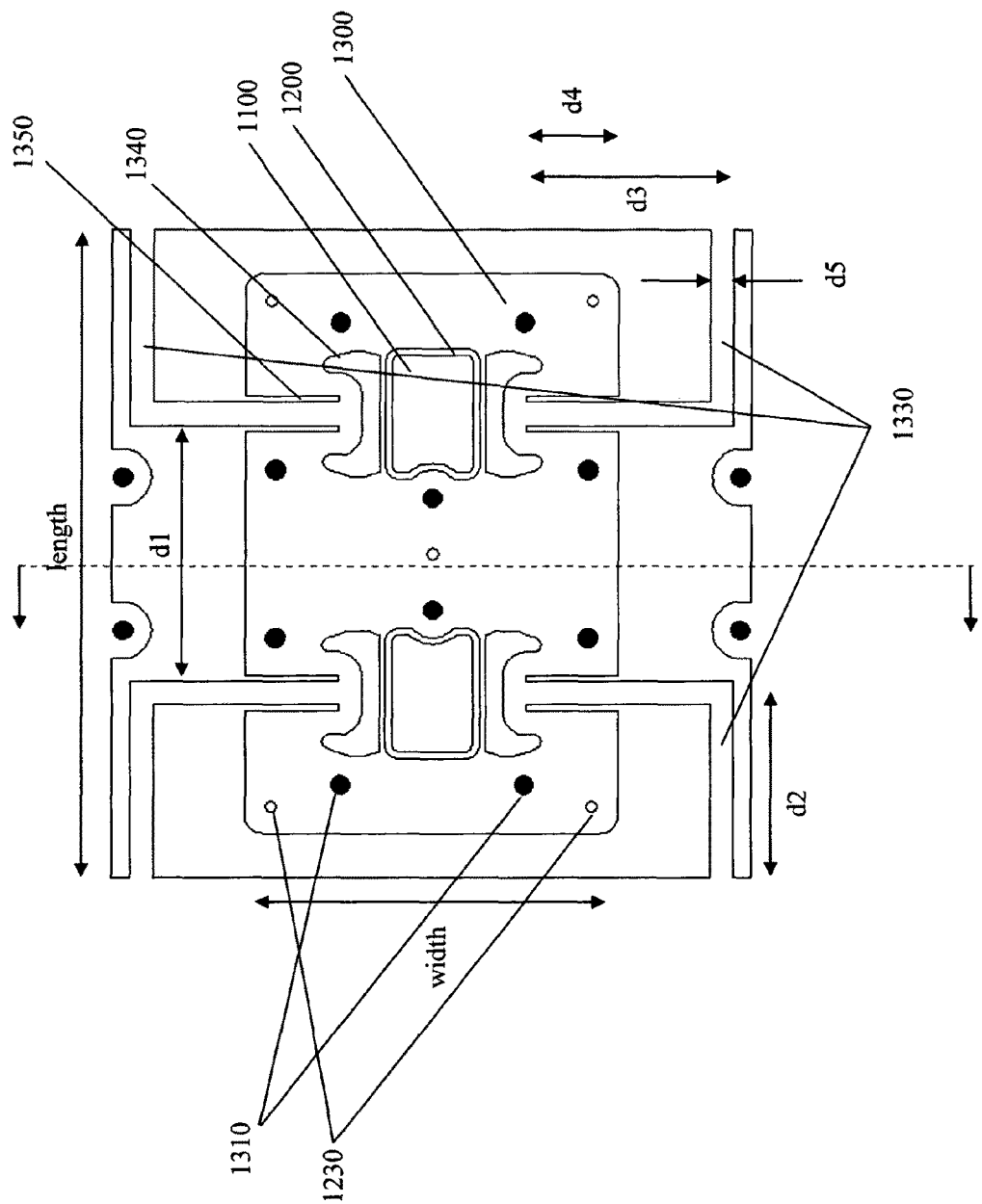
FIG. 6 is a plan view of a design for a third exemplary embodiment of a deformable plate usable in the dual substrate MEMS plate switch of FIG. 1.

FIG. 6 is a plan view of a layout of deformable plate 1300, showing additional detail of the embodiment. In particular, spring beams 1330 are formed with cutouts 1350 which penetrate the deformable plate 1300. The deformable plate may also have relieved areas 1340 formed near the locations of the shunt bars 1100. Both the cutouts 1350 and the relieved areas 1340 give the deformable plate additional flexibility in the area of the junction with the spring beams 1330. This may help decouple the motion of the plate 1300 from the deflection of the spring beams 1330. These features 1350 and 1340 may also help the deformable plate 1300 to close the switch effectively, in the event that the contacts 2210 and 2220 are recessed somewhat from the surface of the via substrate 2000, by giving the deformable plate 1300 additional flexibility in the region around the shunt bars 1200.

As shown in FIG. 6, deformable plate 1300 may have a length of about 300 μm and a width of about 200 μm. The separation d1 between the spring beams may be about 130 μm. The lengths of each segment d2 and d3 of the spring beams 1330 may be about 100 μm, so that the total length of the spring beams 1330 is about 200 μm. The lengths d4 of the cutouts 1350 may be about 50 μm, or about half the length of the beam segment d3. The width of the spring beam 1330 may be about 12 μm. The distance between the relieved areas 1340 may also be about 100 μm. The dimensions of the shunt bars 1100 may be about 40 μm width and about 60 μm length. The diameter of the via contacts 2110 and 2120 may be about 30 μm to about 50 μm. It should be understood that these dimensions are exemplary only, and that other dimensions and designs may be chosen depending on the requirements of the application.

Since the deformable plate 1300 may be made from the device layer 1010 of the SOI plate substrate 1000, it may be made highly resistive, of the order 20 ohm-cm. This resistivity may be sufficient to carry the actuation voltage of about 40 volts, but may too high to support the higher frequency alternating current voltages associated with the first vibrational mode at about 73 kHz. Accordingly, the resistivity may electrically dampen capacitive plate vibrations, especially the whole-body first mode plate vibration.

The electrostatic plate switch design illustrated in FIG. 6 may have a number of advantages over cantilevered switch designs, wherein the switch contacts are disposed at the end of a cantilevered beam. For example, as described above, multiple sets of switch contacts may be provided along a deformable plate, thereby reducing the overall switch resistance and therefore the loss across the switch. The multiple switch contacts also provide redundancy, such that the switch may still be useable even if one set of switch contacts fails. These design options are generally not available in a cantilevered switch design, because the contacts are necessarily placed at the distal end of the cantilevered beam.

In addition, the electrostatic deformable plate switch 100 may be made more compact than a cantilevered switch, because a long length of cantilevered beam is not required to have a sufficiently flexible member to actuate with modest voltages. For example, the plate design illustrated in FIG. 6 may be actuated with only 40 volts, because the spring beams 1330 which support the deformable plate may be made relatively flexible, without impacting the spacing between the electrical contacts 2110 and 2120.

Because the restoring force of the switch is determined by the spring beam 1330 geometry, rather than the plate 1300 geometry, modifications may be made to the plate 1300 design without affecting the kinematics of the spring beams 1330. For example, as mentioned above, a plurality of etch release holes 1310 may be formed in the deformable plate 1300, without affecting the stiffness of the restoring spring beams 1330. These release holes 1310 may allow air or gas to transit readily from one side of the deformable plate 1300 to the other side, thereby reducing the effects of squeeze film damping, which would otherwise reduce the speed of the device. These etch release holes 1310 may also reduce the mass of the deformable plate 1300, also improving its switching speed, without affecting the restoring force acting on the deformable plate 1300 through the spring beams 1330.

By placing the shunt bars near the nodal lines of a vibrational mode, the switching speed may be improved because the shunt contact interferes with vibratory motion in other modes. This effectively damps the vibrations in other modes. By placing the shunt bars at the nodal lines of a vibrational mode, the movement of the shunt bar is minimal, even if the plate is still vibrating in this mode. Therefore, although the deformable plate may be made exceptionally light and fast because of its small size and plurality of etch release holes, its vibrations do not adversely affect the interaction of the shunt bar to the opposite contacts and therefore, the functionality of the switch. Accordingly, the electrostatic MEMS plate switch illustrated in FIG. 6 may be used in a vacuum environment, which is often not possible because in a vacuum, vibrations are no longer damped by viscous air motion around the moving member of the switch.

Because through wafer vias are used to route the signal to and from the dual substrate electrostatic MEMS plate switch 100, the switch 100 may be particularly suited to handling high frequency, RF signals. Without the through wafer vias, the signal would have to be routed along the surface of the second via substrate 2000, and under the hermetic bond line. However, because the hermetic bond line is metallic and grounded, this allows substantial capacitive coupling to occur between the surface-routed signal lines and the ground plane of the device, which lies directly adjacent to, and narrowly separated from the signal lines in the bonding area. The through wafer vias allow this geometry to be avoided, thus reducing capacitive coupling and substantially improving the bandwidth of the device. The through wafer vias may also act as heat sinks, leading the heat generated in the switch to be directed quickly to the opposite side of the wafer and to the large bonding pads 2115 and 2125 on the backside of the device for dissipation.

Details of an exemplary method for manufacturing the dual substrate plate switch are set forth in U.S. patent application Ser. No. 11/797,924, which was incorporated by reference. Briefly, the device may be made by removing the dielectric layer in the region near the movable feature, and then etching the outline of the movable feature in the device layer of the SOI wafer, The SOI wafer with the movable feature is then bonded to the via wafer and diced to singulate the devices.

Figure 7:
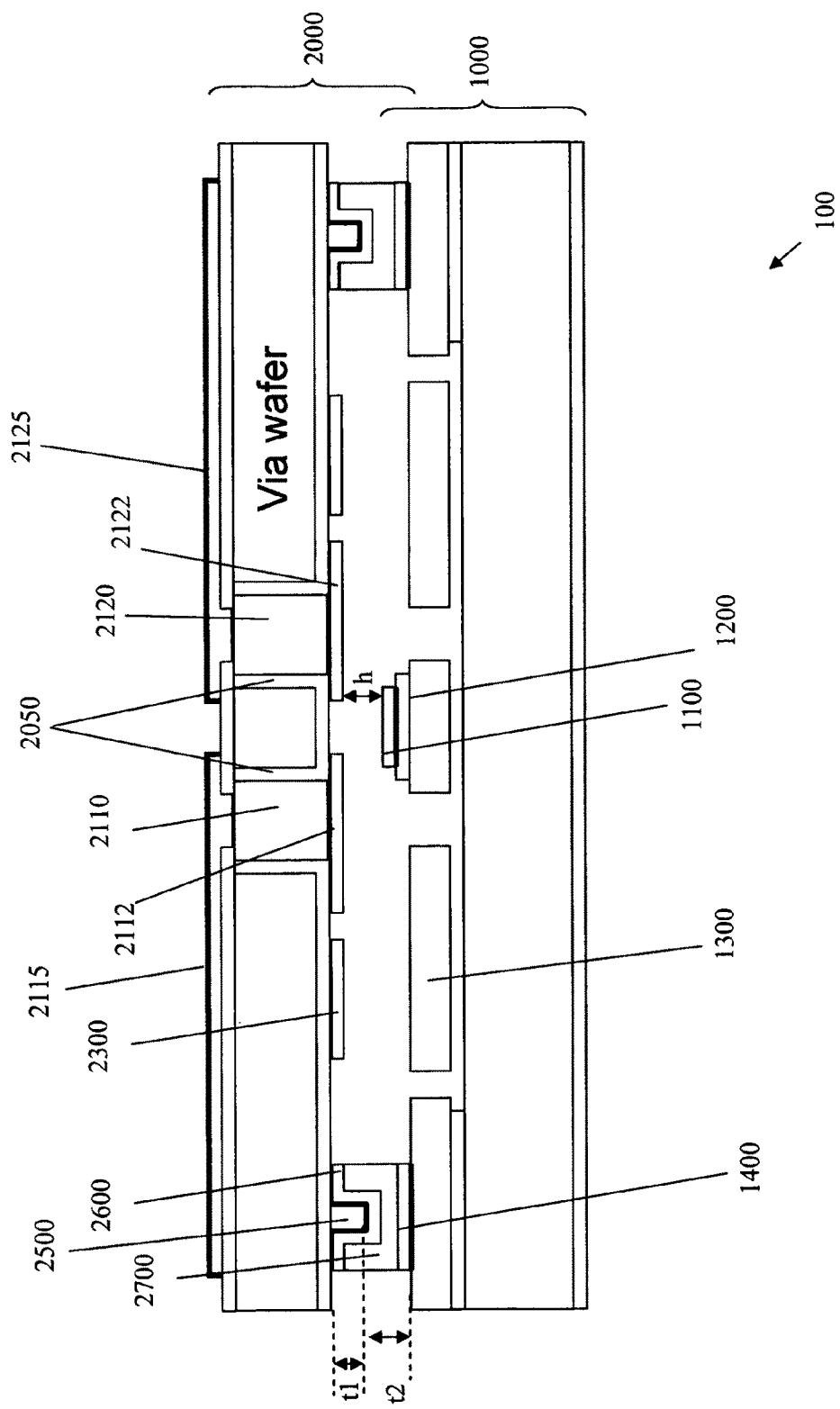
FIG. 7 is a diagram of the completed dual substrate MEMS plate switch of FIG. 1, with an indication of the cross section shown in FIG. 16.

FIG. 7 shows an individual dual substrate electrostatic MEMS plate switch 100 after manufacture and assembly. In its completed state, the shunt bar 1100 on the deformable plate 1300 hangs adjacent to and spanning the electrical contacts 2110 and 2120, and the deformable plate 1300 is also adjacent to the metallization plate 2300, as shown in FIG. 1. Upon applying appropriate voltages to vias 2400 and 2450 using conductive bonding pads 2405 and 2455, respectively, a differential voltage forms across the parallel plate capacitor formed by the deformable plate 1300 and the electrode 2300, drawing the deformable plate 1300 toward the electrode 2300. At it lower point of travel or vibration of the deformable plate 1300, the shunt bar 1110 affixed to the deformable plate 1300 is applied across the electrical contacts 2110 and 2120 of the switch 100, and shunt bar 1120 is applied across electrical contacts 2210 and 2220, thereby closing the switch. An input electrical signal applied to one of the electrical contacts 2110 and 2210 by conductive bonding pad 2115 may then be obtained as an output electrical signal from either of the other contacts 2120 or 2220 by the other conductive bonding pad 2125. The switch may be opened by discontinuing the voltages applied to the plate 1300 and electrode 2300, whereupon the switch may return to its original position because of the restoring spring force acting on the stiff spring beams 1330 coupled to the deformable plate 1300.

Exemplary thicknesses of various layers of the dual substrate electrostatic MEMS plate switch 100 are shown in FIG. 7. It should be understood that the features depicted in FIG. 7 may not necessarily be drawn to scale. As shown in FIG. 7, an exemplary thickness of the conductive layer 2600 is about 0.75 μm. An exemplary distance h between the upper surface of the shunt bar 1100 and the lower surface of the contact point 2112, also defined as the throw of the switch, may be, for example, about 1.0 µm. An exemplary thickness of the conductive material of the shunt bar 1100 and contacts 2122 and 2112 may be, for example, about 0.75 µm each. An exemplary thickness of the deformable plate 1300 may be about 5.0 µm, which may also be the thickness of the device layer 1010. An exemplary thickness of the isolation layer 1200 may be about 0.3 µm. Finally, an exemplary thickness t1 of the polymer standoff 2520 may be about 1.0 µm, which also defines a minimum separation between the plate substrate 1000 and the via substrate 2000, of the dual substrate electrostatic MEMS plate switch 100. An exemplary thickness t2 of the alloy bond (In material as well as Cr/Au multilayers) may be about 1.7 µm. It should be understood that the dimensions set forth here are exemplary only, and that other dimensions may be chosen depending on the requirements of the application.

As mentioned previously, in the exemplary implementation 100 shown in FIG. 7, the switch is actuated by generating a voltage difference between the electrostatic electrode 2300 and the deformable plate 1300. In one convenient implementation, the deformable plate 1300 is held at ground potential, and a large negative (about −50V) voltage is applied to the electrostatic electrode 2300. In order to maintain the deformable plate at ground potential, the hermetic metal seal 2700, which is electrically coupled to the deformable plate 1300, may be grounded. However, other means for delivering a particular voltage to deformable plate 1300 are also envisioned. In these other embodiments, an electrical path is provided to the deformable plate, wherein this electrical path is independent of the seal. That is, the voltage is provided to the deformable plate through a path that does not necessarily include the metal seal 2700.

Figure 8:
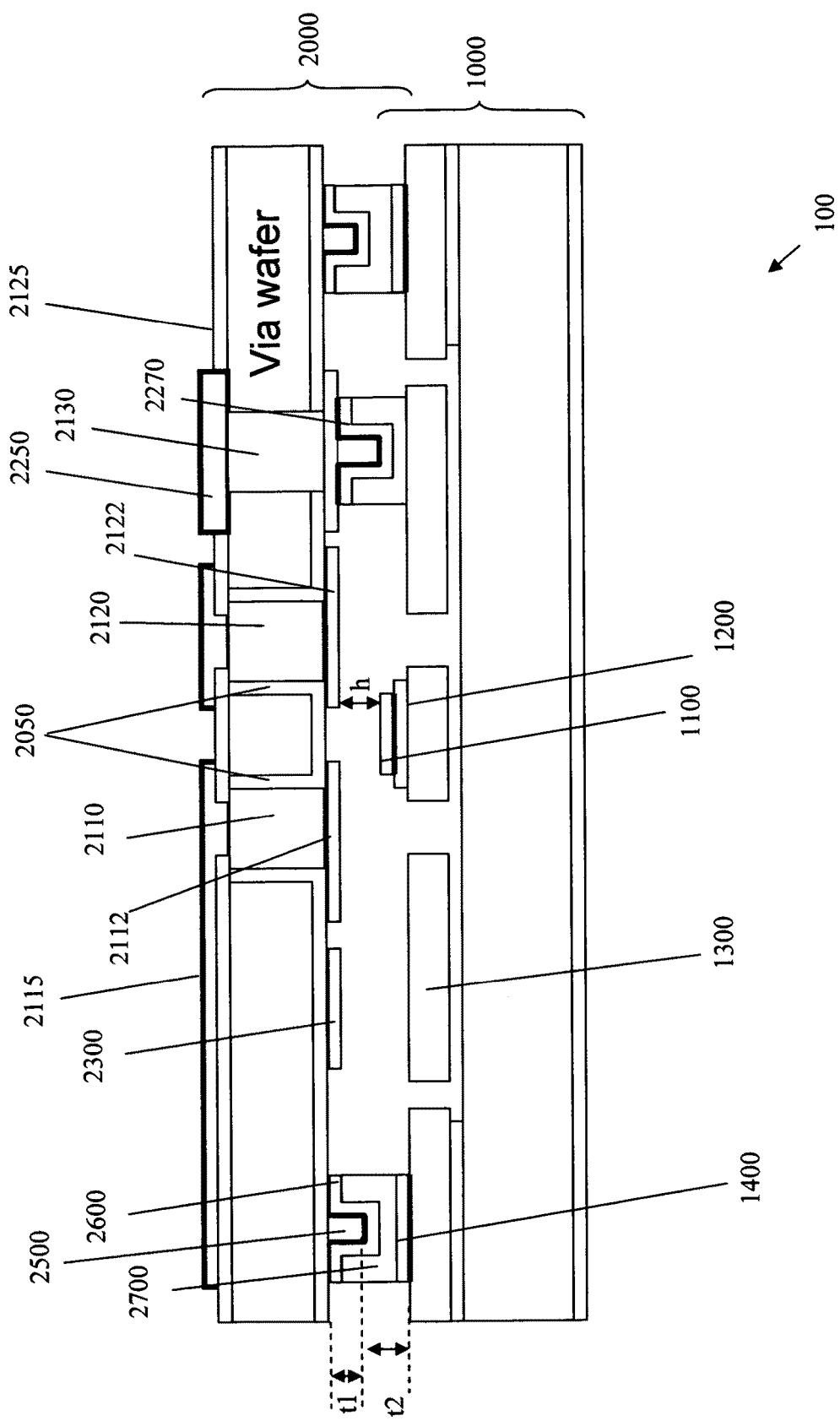
FIG. 8 is a cross sectional diagram showing an embodiment with an additional via made in the via wafer, which carries the deformable plate potential.

One such alternative means is shown in FIG. 8. In this exemplary embodiment, an additional via may be made in the via wafer, which carries the deformable plate potential. In this embodiment, the additional via 2130 is formed in the via wafer 2000, and topped with an electrical pad 2250. The additional via 2130 may be made using the same process as used for vias and associated pads 2110 and 2120. In the case of additional via 2130, instead of a contact pad 2112 and 2122, the via may end in at a metal connection 2270, which delivers the voltage from the additional via 2130 and electrical pad 2250, to the deformable plate 1300. Therefore, by applying the deformable plate voltage to electrical pad 2250, the voltage is transmitted to the deformable plate 1300 by the metal bond 2270 and via 2130. The motion of the deformable plate 1300 may not be altered or impeded as the metal connection 2270 may be made in an area of the device layer 1010 which is firmly adhered to the handle layer 1030 by the dielectric layer 1020.

The advantages of having the dedicated additional via are that the bondline 2700 adhering the via wafer 2000 and the switch wafer 1000 need no longer be conductive, thus a wide variety of additional adhesives may be used. Inversely, the bond creating the electrical connection to the via no longer has to be hermetic further increasing the types of bonding technology that may be used. Furthermore, the use of a dedicated via to deliver the plate voltage may provide different and desirable RF characteristics at high frequencies, at which capacitive coupling is otherwise an issue. The device layer may still be electrically coupled to the handle layer using any combination of techniques, including individual vias to the various layers from a common pad, and flashes on the external surfaces.

Figure 9:
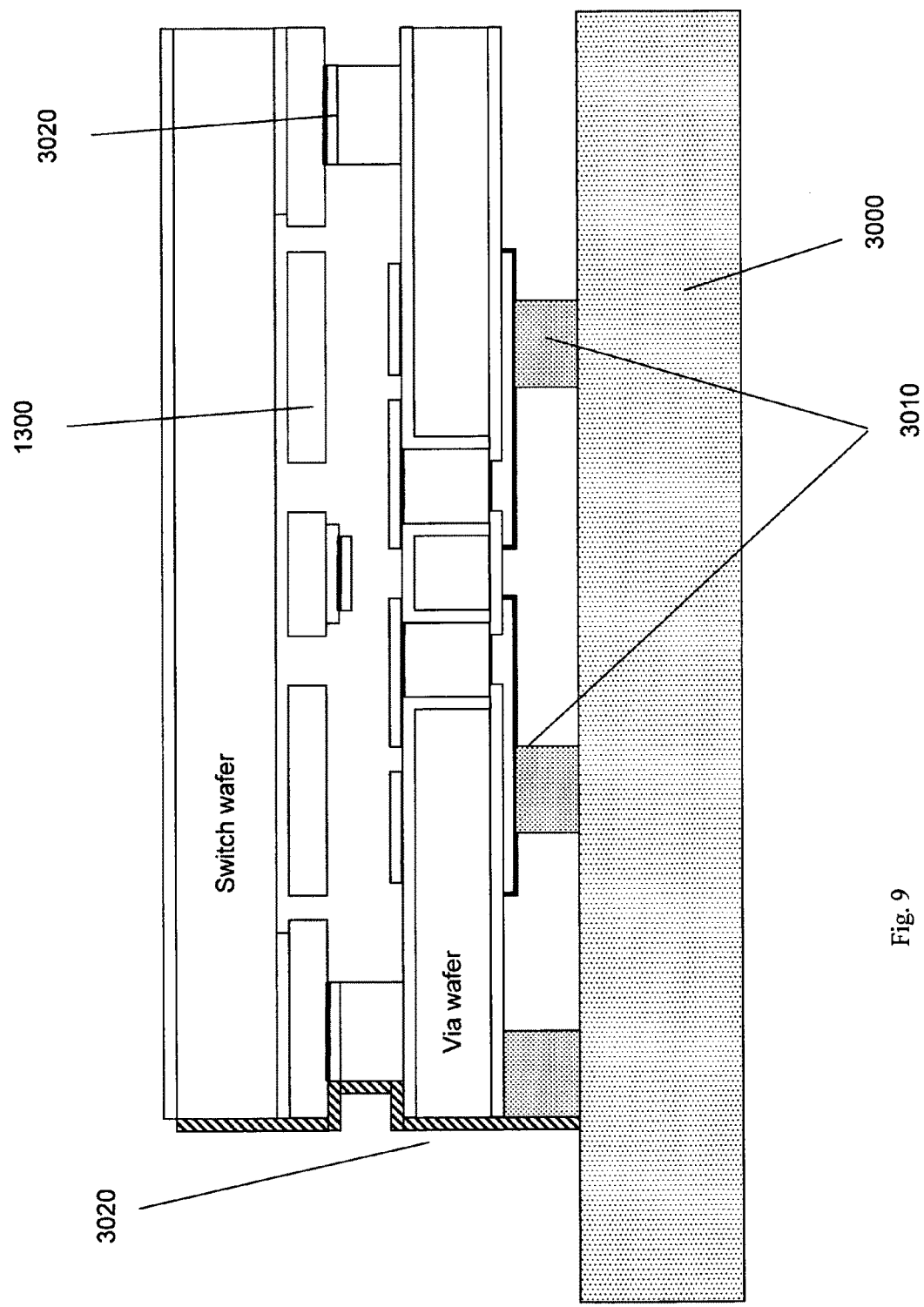
FIG. 9 is a cross sectional diagram showing an embodiment wherein a conductive flash provides a conductive path from a circuit board to the switch.

Yet another approach to grounding the deformable plate 1300 is shown in FIG. 9. In this approach, a conductive flash 3020 is deposited over a side of the device 100, providing a conductive path from a circuit board 3000 to the switch 100. The circuit board 3000 may provide a plurality of conductive traces insulated from one another. One of these traces may be held at ground potential and coupled to the deformable plate 1300 through the conductive flash 3020. The conductive flash 3020 may be deposited using a sputter deposition through a mask, vapor or plasma deposition through a mask, and manually after the wafer stack has been diced into die. The conductive flash may be gold, copper, or other metal or metal alloy, for example.

The signal and voltage lines to the switch 100 may be provided by bump bonding through solder bumps 3010 to the circuit board 3000. In this embodiment, the device 100 is flip-chip bonded to the circuit board 3000. As shown in FIG. 9, the device 100 may be inverted so that the via wafer 2000 is directly adjacent to the circuit board 3000.

Figure 10:
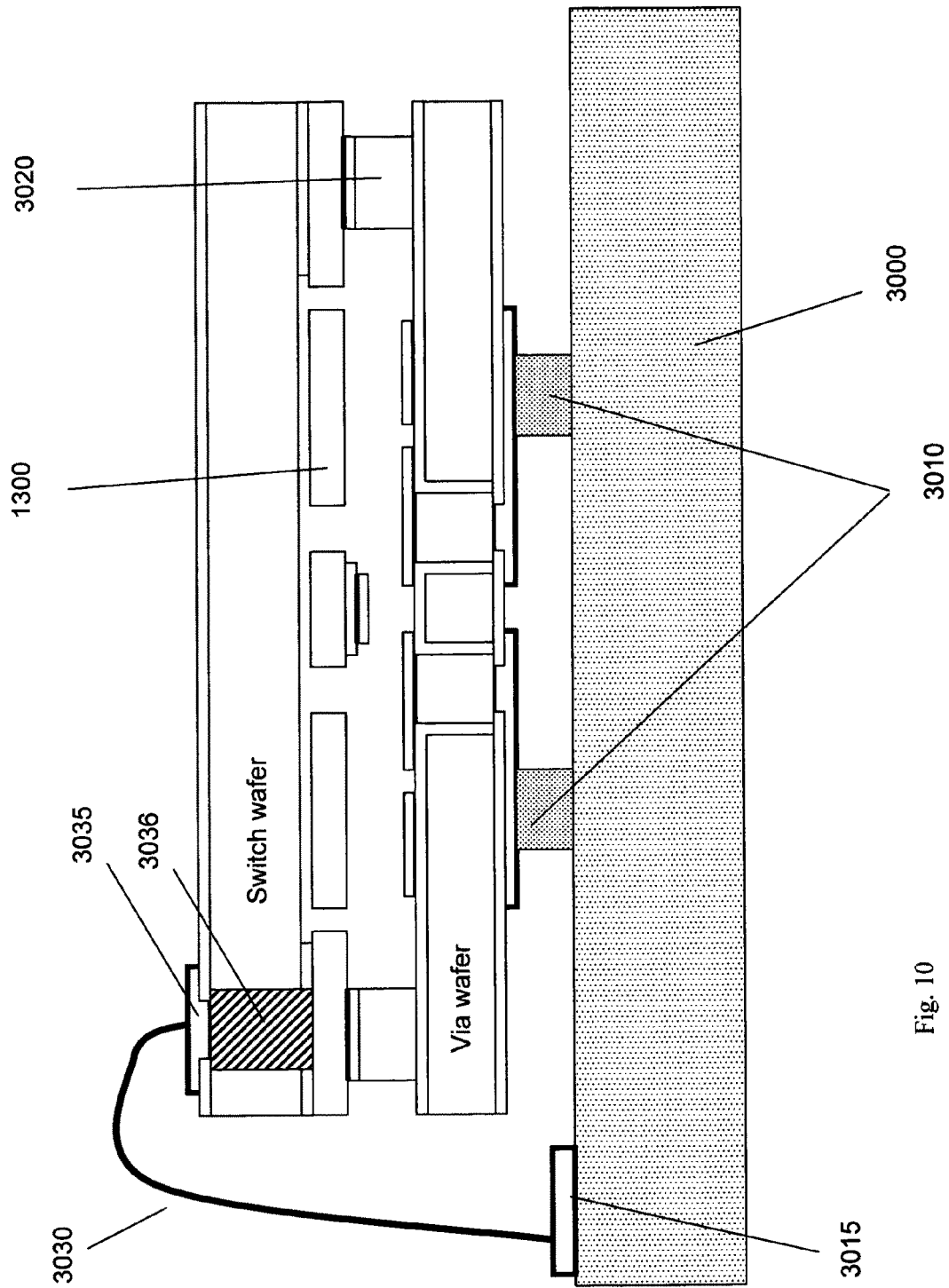
FIG. 10 is a cross sectional diagram showing an embodiment wherein a reference voltage provided through the switch wafer rather than the via wafer.

FIG. 10 shows yet another embodiment for providing a reference voltage to the deformable plate 1300. In this embodiment, the reference voltage may be provided through the switch wafer 1000 rather than the via wafer 2000. In the embodiment shown in FIG. 10, the device 100 is again flip-chip bonded to a circuit board 3000 through a plurality of solder bumps 3010, so that their positions are inverted relative to previous depictions in FIGS. 1, 7, and 8. The circuit board provides the reference voltage along a particular trace 3015 on the circuit board 3000. A wire 3030 conducts the reference voltage from the circuit board 3000 to a pad 3035 on the top side of the device 100. The wire may be soldered or otherwise conductively attached to the bond pad 3035, which is formed over a through wafer via 3036. The through wafer via 3036 extends through the handle layer and dielectric layer, to the device layer and deformable plate 1300.

Figure 11:
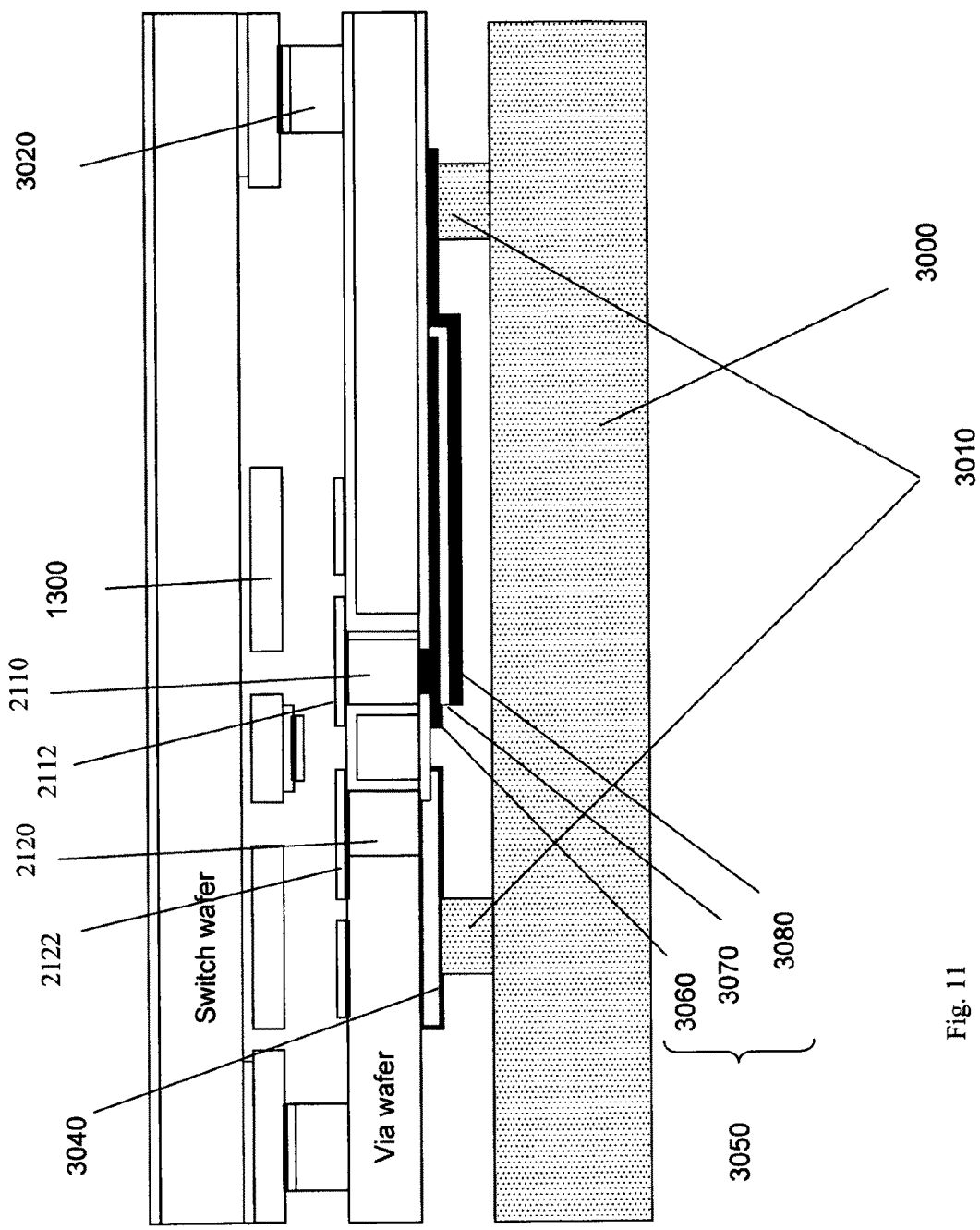
FIG. 11 is a cross sectional diagram showing and embodiment wherein the plate switch is coupled with a microfabricated capacitor.

FIG. 11 illustrates another embodiment of the dual substrate plate switch 100. In this embodiment, the dual substrate plate switch is coupled with a microfabricated capacitor 3050. The microfabricated capacitor 3050 may be laid out as shown in FIG. 11, with one plate 3060 of the capacitor being an extended electrical pad coupled to one of the plurality of switch contacts 2112. Switch contact 2112 is coupled to plate 3060 by via 2110. The other switch contact 2122 may be coupled to another input line 3140. Input line 3140 may be coupled to a circuit board 3000 by solder bump 3010.

The conductive materials which may be used for conductive features 1100, 2300, 2112, 2122 and 3030 may actually be a multilayer comprising first a thin layer of chromium (Cr) for adhesion to the silicon and/or silicon dioxide surfaces. The Cr layer may be from about 5 nm to about 20 nm in thickness. The Cr layer may be followed by a thicker layer about 300 nm to about 700 nm of gold (Au), as the conductive metallization layer. Preferably, the Cr layer is about 15 nm thick, and the gold layer is about 600 nm thick. Another thin layer of molybdenum may also be used between the chromium and the gold to prevent diffusion of the chromium into the gold, which might otherwise raise the resistivity of the gold. Alternatively, an adhesion layer of a 50% Titanium-Tungsten alloy (TiW) may be used as an adhesion layer between the Gold metallization layer and the Silicon substrate.

The conductive material deposited and patterned to form these features may also a portion of what will form the hermetic seal 2700. The hermetic seal may include a metal alloy formed from melting a first metal into a second metal, and forming an alloy of the two metals which blocks the transmission of gases. In preparation of forming the hermetic seal, a perimeter of the first metal material 2600 may be formed around the deformable plate 1300. The conductive material may by gold Au, and a second metal, for example indium In, may be deposited over the gold layer Au. When heated, the gold and indium alloy to form, for example, $AuIn_2$ which has a much higher melting temperature than the elemental indium In. This process is described more fully in U.S. Pat. No. 7,569,926, incorporated by reference in its entirety, and assigned to the same assignee as the present invention.

Each of the Cr/TiW and Au layers may be sputter-deposited using, for example, an ion beam deposition chamber (IBD), or plated using a plating bath. The conductive material may be deposited in the region corresponding to the shunt bar 1100, and electrostatic plate 2300, pads 2112 and 2122, and also the regions which will correspond to the bond line 1400 between the plate substrate 1000 and the via substrate 2000 of the dual substrate electrostatic MEMS plate switch 100. This bond line area 1400 of metallization will form, along with a layer of indium, a seal which will hermetically seal the plate substrate 1000 with the via substrate 2000, as was described above.

While a Cr/Au multilayer is disclosed as being usable for the metallization layer of the shunt bar 1100, it should be understood that this multilayer is exemplary only, and that any other choice of conductive materials or multilayers having suitable electronic transport properties may be used in place of the Cr/Au multilayer disclosed here. For example, other materials, such as titanium (Ti) may be used as an adhesion layer between the Si and the Au. Other exotic materials, such as ruthenium (Ru) or palladium (Pd) can be deposited on top of the Au to improve the switch contact properties, etc. However, the choice described above may be advantageous in that it can also participate in the sealing of the device through the alloy bond, as will be described more fully below.

Figure 12:
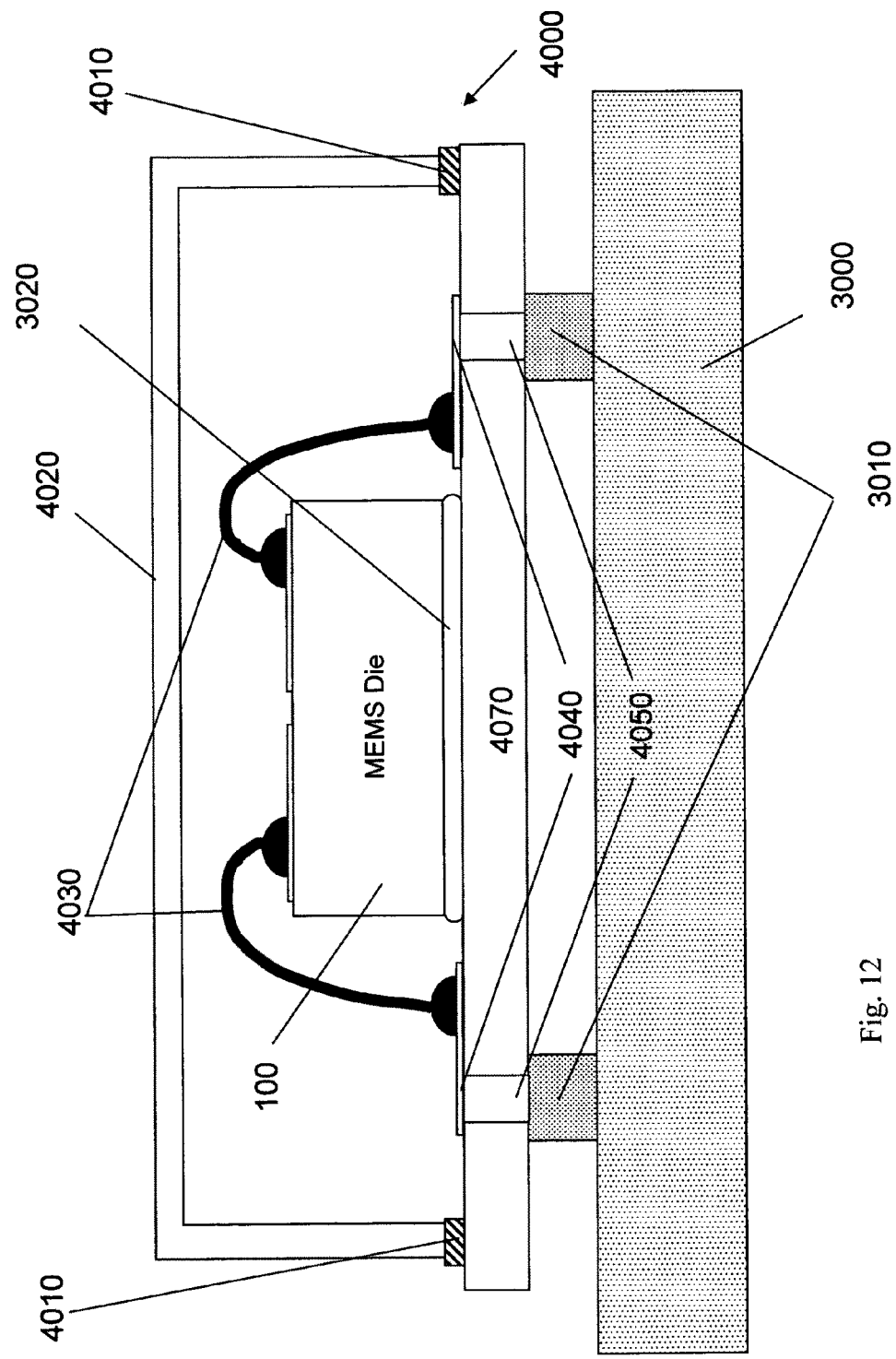
FIG. 12 is a cross sectional diagram showing an embodiment which does not require a hermetic seal between the switch substrate and the via substrate.

FIG. 12 illustrates an embodiment of the dual substrate plate switch 100 which does not require a hermetic seal between the switch substrate 1000 and the via substrate 2000. In this embodiment, the switch substrate 1000 may be bonded to the via substrate 2000 with any convenient adhesive, for example, glue, cement or epoxy. Or the adhesive may be chosen to have a similar coefficient of thermal expansion to the silicon substrates, so that repeated temperature cycling in unlikely to damage the integrity of the bond. In this embodiment, since the bond is not necessarily hermetic, the singulated device may be placed inside another secondary enclosure 4000 which is hermetic. The secondary enclosure 4000 may be formed using any convenient materials, such as a plastic or ceramic outer enclosure 4020, which maybe bonded to a base 4070 which may be a silicon substrate or other convenient material that offers a hermetic barrier. Vias 4050 may provide electrical access to electrical pads 4040 within the enclosure 4000. Wirebonds 4030 may then connect the dual substrate MEMS switch 100 to the electrical pads 4040. A simple mechanical adhesive 3020 may adhere the MEMS switch 100 to the base 4070. This bond, of course, also need not be hermetic.

The hermetic seal 4010 may be provided between the outer enclosure 4020 and the base 4070. This hermetic seal maybe, for example, glass flit or a metal alloy or any other convenient non-leaking adhesive material. Because the hermetic seal may be applied between different structures rather than the wafer material of the device, a wider selection of adhesive materials can be considered in the design. Furthermore, relatively large forces may be applied to the enclosure 4000 without threatening the integrity of the MEMS switch 100. Finally, materials may be used which have volatile compounds, because these compounds cannot easily penetrate the MEMS switch 100 where they could otherwise contaminate the contacts 2112, 2122 and 1100.

For wafer level packaging of very small die, the internal or sealed volume is so small that hermaticity testing is can be difficult. With a larger package, the hermiticity can be verified more easily. In the case where multiple dies and various passive devices such as MEMS air inductor and capacitors are to be integrated together, it is more cost effective to create not individual hermetic seals but one large seal. In the case of air inductors, caps are not necessary for the function of the device but some form of protection of debris prevention may be. Thus a single large cap covering all the devices may be cheaper.

The creation of a hermetic seal can require multiple masking layers and deposition steps. These steps sometimes cause problems with features of the MEMS device. This situation may create defects and reliability in the product and a consequential cost impact. In some cases, it may cause a material compatibility problem, preventing the use of the best candidate materials for the application.

For example, FIG. 12 also shows the condition where a wire bonded die can have a secondary package to enable surface mount technology to be used. In some cases the creation of solder bumps on a MEMS die is not desirable due to bond pad material incompatibilities, solder bump process chemicals leaking into the device, and the larger pad size required for this process. The aforementioned advantages may all accrue to the embodiment with a secondary package as shown in FIG. 12.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a number of fabrication steps and exemplary thicknesses for the layers included in the MEMS switch, it should be understood that these details are exemplary only, and that the systems and methods disclosed here may be applied to any number of alternative MEMS or non-MEMS devices. Furthermore, although the embodiment described herein pertains primarily to an electrical switch, it should be understood that various other devices may be used with the systems and methods described herein, including actuators and valves, for example. Accordingly, the exemplary implementations set forth above, are intended to be illustrative, not limiting.

What is claimed is:

1. A method for manufacturing an electrostatic MEMS device, comprising:
   providing a silicon-on-insulator substrate including a silicon device layer, and insulating layer and a silicon handle layer;
   forming a first plate in the device layer of the silicon-on-insulator substrate and suspended adjacent to the handle layer of the silicon-on-insulator substrate, wherein the first plate is coupled to the silicon-on-insulator substrate by a plurality of spring beams;
   forming an electrical contact on a second substrate, wherein the first plate is configured to move toward the at least one electrical contact when a voltage is applied between the first plate and the electrical contact;
   coupling the device layer of the silicon-on-insulator substrate to the second substrate with a seal that seals the MEMS device;
   forming and an electrical path which delivers the voltage to the first plate, wherein the electrical path is independent of the seal that seals the MEMS device.

2. The method of claim 1, further comprising:
forming a secondary hermetic enclosure around the electrostatic MEMS device.

3. The method of claim 2, wherein the voltage is delivered to the first plate by a through wafer via formed in the first substrate.

4. The method of claim 2, wherein the first voltage is delivered to the first plate by a layer of metal deposited on at least a portion of the switch, which provides an electrical path from the first plate to a circuit board.

5. The method of claim 1, further comprising:
forming at least one electrical via through a thickness of the second substrate, and electrically coupling the at least one electrical via to the at least one electrical contact.

6. The method of claim 5, wherein forming the at least one electrical via comprises:
forming at least one blind hole with a dead end wall on a front side of the second substrate;
forming a seed layer in the at least one blind hole;
depositing a conductive material onto the seed layer; and
removing material from a rear side of the second substrate to remove the dead-end wall of the at least one blind hole.

7. The method of claim 6, wherein depositing a conductive material onto the seed layer comprises plating copper onto the seed layer.

8. The method of claim 1, wherein coupling the first substrate to the second substrate with a seal comprises:
depositing a first metal between the first substrate and the second substrate; and
depositing a second metal between the first substrate and the second substrate; and
coupling the first substrate to the second substrate by heating the first metal and the second metal to at least a melting point of at least one of the first metal and the second metal, to form a substantially hermetic alloy seal around the MEMS device.

9. The method of claim 1, wherein the second substrate comprises at least one of a silicon wafer and a silicon-on-insulator substrate.

10. The method of claim 9, wherein forming the first plate suspended over the first substrate comprises:
etching a plurality of holes into a device layer of the silicon-on-insulator substrate;
etching a dielectric layer beneath the device layer of the silicon-on-insulator substrate through the plurality of holes; and
etching an outline of the first plate in the device layer of the silicon-on-insulator substrate.

11. An electrostatic MEMS device, comprising:
a first plate formed in a device layer of a first silicon-on-insulator substrate having a device layer, dielectric layer and a silicon device layer, wherein the first plate is suspended adjacent to the handle layer of the silicon-on-insulator substrate, and coupled to the substrate by at least one spring beam;
an electrostatic plate formed on a second substrate, wherein the first plate is configured to move toward the electrostatic plate;
a seal which couples the device layer of the first substrate to the second substrate, and seals the MEMS switch, and wherein when a first voltage is delivered to the first plate and a second voltage is delivered to the at least one electrostatic plate, an attractive force arises between the first plate and the at least one electrostatic plate, and wherein the first voltage is delivered to the first plate along an electrical path that is independent of the seal.

12. The electrostatic MEMS device of claim 11, wherein the first voltage is delivered to the first plate by a layer of metal deposited on an external portion of the switch, which provides an electrical path from the first plate to a circuit board.

13. The electrostatic MEMS device of claim 11, wherein the at least one additional via is formed in the second substrate.

14. The electrostatic MEMS device of claim 12, further comprising at least one of a microfabricated capacitor, resistor and inductor.

15. The electrostatic MEMS device of claim 12, wherein the seal further comprises a rigid standoff that establishes the separation between the second substrate and the silicon-on-insulator substrate.

16. The electrostatic MEMS device of claim 11, further comprising a secondary enclosure which encloses the electrostatic MEMS device with a hermetic seal.

17. The electrostatic MEMS device of claim 11, further comprising:
electrical vias formed through a thickness of the second substrate; and
an electrostatic second plate formed on the second substrate.

18. The electrostatic MEMS device of claim 11, further comprising:
a plurality of holes formed through a thickness of the first plate, wherein the plurality of holes is disposed in at least one of the following ways: substantially along a latitudinal axis of the first plate, and in a close-packed hexagonal array.

19. The electrostatic MEMS device of claim 11, wherein the seal comprises:
a gold/indium alloy which bonds the first substrate to the second substrate with a substantially hermetic seal around the MEMS device.

20. The electrostatic MEMS device of claim 11, wherein the first plate has at least one shunt bar, located substantially on a nodal line of a vibrational mode of the first plate.

21. The electrostatic MEMS device of claim 11, wherein electrical access to the electrostatic MEMS device is accomplished with wire bond connecting a bump bond on a printed circuit board with the electrostatic MEMS device supported on the printed circuit board.

22. The electrostatic MEMS device of claim 11, wherein electrical access to the electrical plate and the at least one additional via from traces on a printed circuit board is accomplished by bump bonding the electrostatic MEMS device to the traces on the printed circuit board.

* * * * *